United States Patent [19]
Kato et al.

[11] Patent Number: 5,945,892
[45] Date of Patent: *Aug. 31, 1999

[54] LC RESONATING COMPONENT AND METHOD OF MAKING SAME

[75] Inventors: Noboru Kato, Sabae; Atsushi Tojyo; Koji Nosaka, both of Fukui, all of Japan

[73] Assignee: Murata Manufacturing Co., Ltd., Nagaokakyo, Japan

[*] Notice: This patent is subject to a terminal disclaimer.

[21] Appl. No.: 08/775,027

[22] Filed: Dec. 27, 1996

[30] Foreign Application Priority Data

Dec. 28, 1995 [JP] Japan .................................. 7-343038
Sep. 2, 1996 [JP] Japan .................................. 8-231724

[51] Int. Cl.$^6$ ...................................................... H03H 5/00
[52] U.S. Cl. ......................................... 333/185; 336/200
[58] Field of Search ................................. 333/184, 185; 336/200

[56] References Cited

U.S. PATENT DOCUMENTS 4,904,967 2/1990 Morii et al. ........................... 333/184 X
5,055,816 10/1991 Altman et al. ........................... 336/200
5,696,471 12/1997 Fujiwara .................................. 333/185

FOREIGN PATENT DOCUMENTS 58-80805   5/1983   Japan ...................................... 336/200
2-260812  10/1990  Japan ...................................... 333/185
4-6911     1/1992   Japan ...................................... 333/185
2303495    2/1997   United Kingdom .

Primary Examiner—Robert Pascal
Assistant Examiner—Justin P. Bettendorf
Attorney, Agent, or Firm—Burns, Doane, Swecker & Mathis, LLP

[57] ABSTRACT

An LC resonating component, such as multilayered LC filter 1, is provided having a high Q-value and a low profile. The filter 1 comprises an insulating sheet 2 having a ground electrode 3 on its surface and in its center a via hole 7 connected to the ground electrode 3, an insulating sheet 2 having a via hole 4 in its center, insulating sheets 2, 2 having capacitor electrodes 5, 6 on their respective surfaces, and a protective insulating sheet 2. The via hole 7 is connected to the via hole 4, wherein the via holes 4 and 7 together comprise an inductor conductive body 8. The inductor conductive body 8 is perpendicular to the planes defined by capacitor electrodes 5, 6, and thus the magnetic flux created around the inductor conductive body 8 does not penetrate the capacitor electrodes 5, 6.

19 Claims, 14 Drawing Sheets

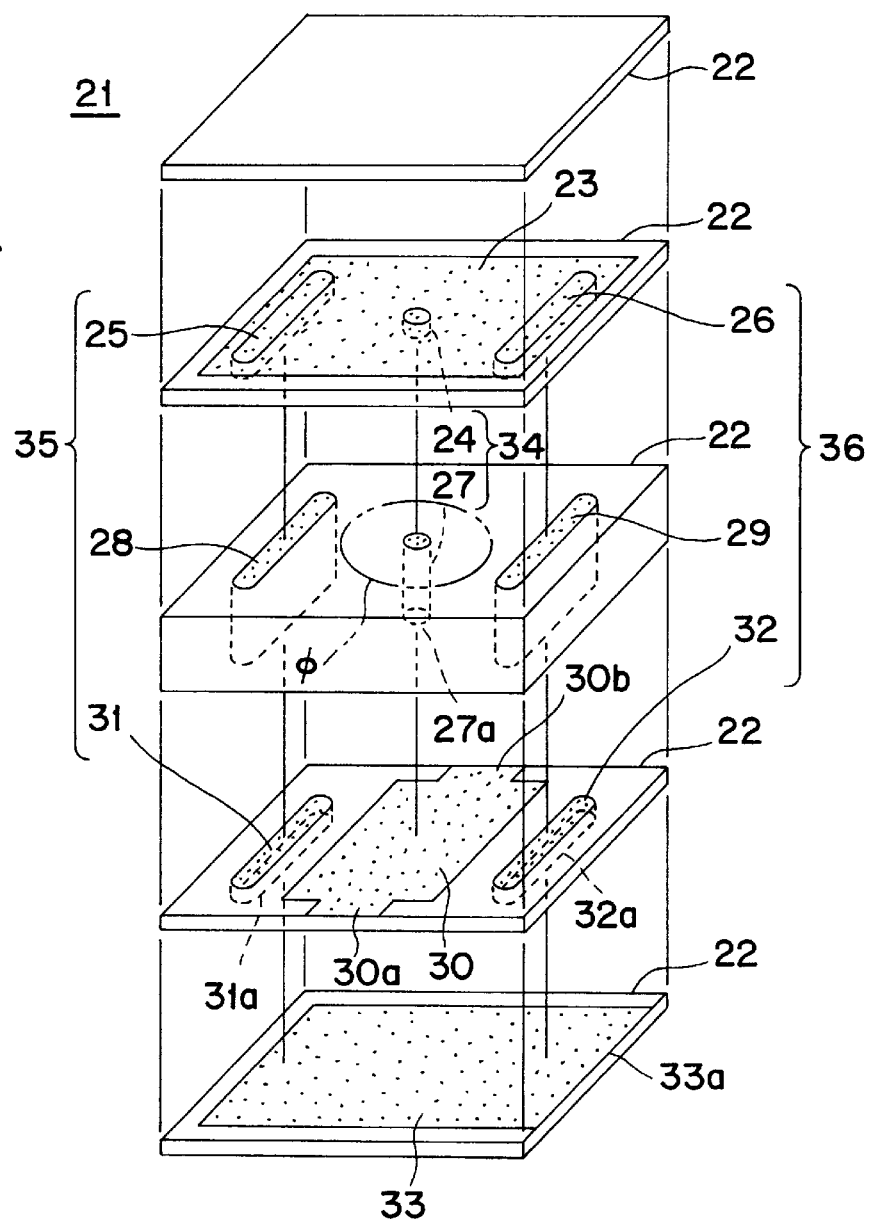
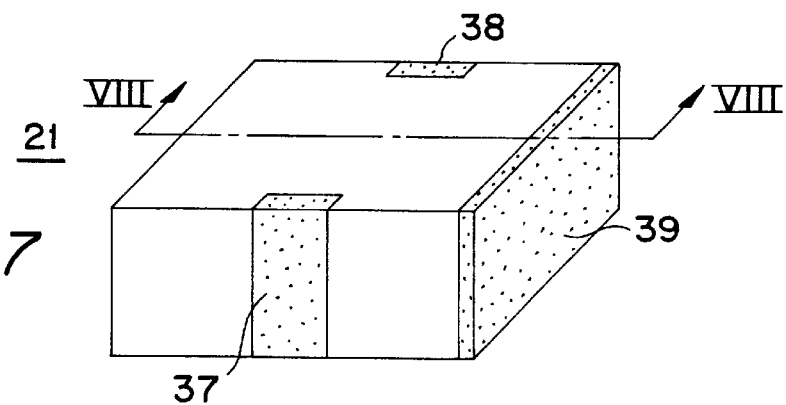

LC RESONATING COMPONENT AND METHOD OF MAKING SAME

BACKGROUND OF THE INVENTION

1. Field of the Invention

The present invention relates to an LC resonating component and, more specifically, to a multilayered LC resonating component for use in high-frequency electronic apparatuses such as portable telephones.

2. Description of the Related Art

As shown in FIG. 25, a known LC (inductance-capacitance) filter 120 comprises an integrated multilayered structure including an insulating sheet 121 having a spiral inductor conductive body 122 thereon, insulating sheets 121 having capacitor electrodes 123, 124 thereon, and an insulating cover sheet 121. The inductive body 122 is electrically connected to the capacitor electrode 123 through a via hole 125 in the insulating sheet 122.

In the prior art LC filter 120, since the inductive body 122 is parallel with the capacitor electrodes 123, 124, magnetic flux φ generated by the inductive body 122 in response to a current flowing therethrough is perpendicular to the capacitor electrodes 123, 124. When the magnetic flux φ penetrates the capacitor electrodes 123, 124, eddy currents are induced in the capacitor electrodes 123, 124, causing an eddy current loss. This lowers the Q-value of the LC filter 120. This problem gets worse as the separation between the inductor conductive body 122 and the capacitor electrode 123 decreases, which places constraints on the permissible thinness of the LC filter.

SUMMARY OF THE INVENTION

Accordingly, it is an exemplary object of the present invention to provide an LC resonating component with a high Q-value and reduced thickness.

To achieve the above object, the LC resonating component of the present invention comprises an inductor conductive body oriented perpendicular to capacitor electrodes. For example, a conductive via hole can be used as the inductor conductive body.

The LC resonating component of the present invention includes an inductor conductive body comprising conductive material filling a hole formed in an insulating body housing the capacitor electrodes, wherein the inductor conductive body is oriented perpendicular to the capacitor electrodes.

In the above arrangement, the inductor conductive body and the capacitor electrodes are perpendicular to each other. The magnetic flux created by the current that flows through the inductor conductive body is parallel to the capacitor electrodes, and, as a result, no eddy current is induced in the capacitor electrodes.

BRIEF DESCRIPTION OF THE DRAWINGS

FIG. 6 is an exploded perspective view showing a second exemplary embodiment of the LC resonating component of the present invention.

FIG. 7 is an external perspective view showing generally the LC resonating component of FIG. 6.

DESCRIPTION OF THE PREFERRED EMBODIMENTS

Embodiment 1

Figure 1:
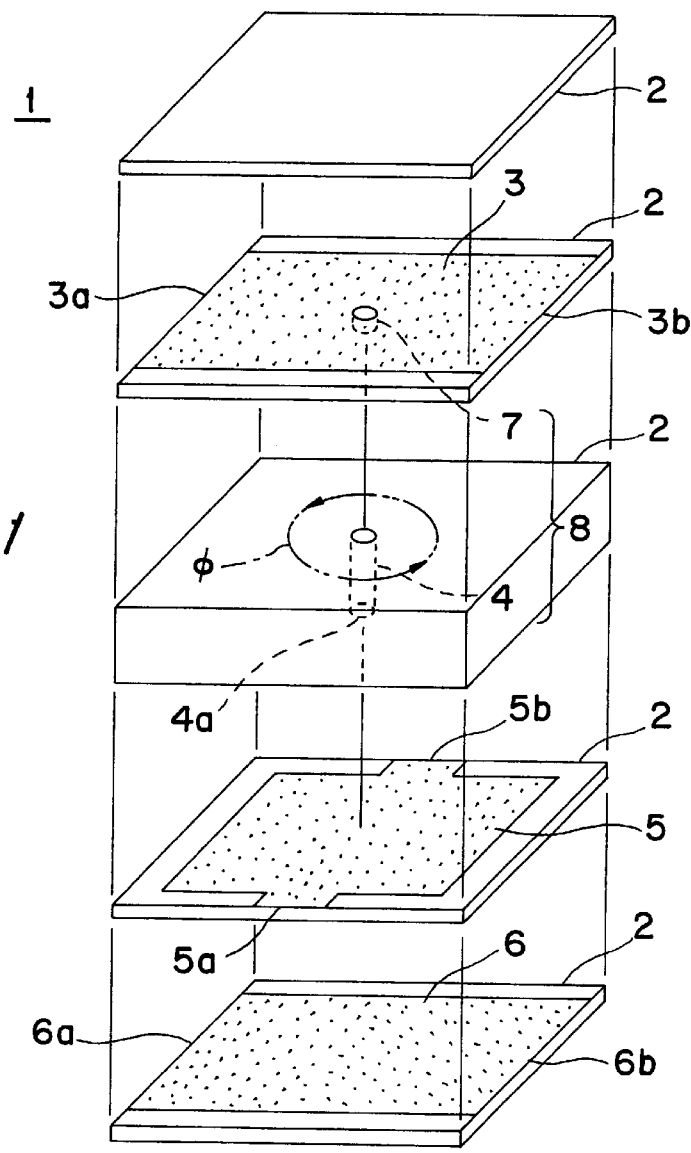
FIG. 1 is an exploded perspective view showing a first exemplary embodiment of the LC resonating component of the present invention.

FIGS. 1 through 5 illustrate a first embodiment of the present invention. As shown in FIG. 1, a multilayered LC filter 1 comprises an insulating sheet 2 having a ground electrode 3 on its top surface and in its center a via hole 7 connected to the ground electrode 3, an insulating sheet 2 having a via hole 4 in its center, insulating sheets 2 having capacitor electrodes 5, 6 on their respective surfaces, and a protective insulating sheet 2.

Each of the insulating sheets 2 comprise a sheet produced by kneading dielectric powder or magnetic material powder with a binding agent or the like. Each of the electrodes 3, 5 and 6 is made of conducting materials such as Ag, Cu, Au, Pd, Ag-Pd, or the like, and is formed using a printing technique or the like. Via holes 4 and 7 are formed by filling the holes formed in insulating sheets 2 with a conductive paste of Ag, Cu, Au, Pd, Ag-Pd, or the like before laminating these sheets with other sheets of the filter.

The ground electrode 3 has side edge portions 3a, 3b exposed on the left and right ends of the sheet 2. (The terms "left", "right", "front" and "back" are used in the context of the exemplary graphical depictions of the Figures.) The via hole 7 is connected to the via hole 4, and together these elements comprise an inductor conductive body 8. The bottom end face 4a of the via hole 4 is directly connected generally to the center of the capacitor electrode 5. The via hole 4 is elongated in its axial direction, and is formed such that its axial direction is parallel with the direction of thickness of the sheets 2. The via hole 4 can be formed by other methods than discussed above. For instance, a via hole can be formed in a plurality of thin sheets, and then these sheets can be layered such that their via holes are connected to each other.

The capacitor electrode 5 has edge portions 5a, 5b exposed respectively at the front and rear ends of its sheet 2. The capacitor electrode 6 paired with the capacitor electrode 5 has side edge portions 6a, 6b exposed respectively to the left and right ends of its sheet 2.

Figure 2:
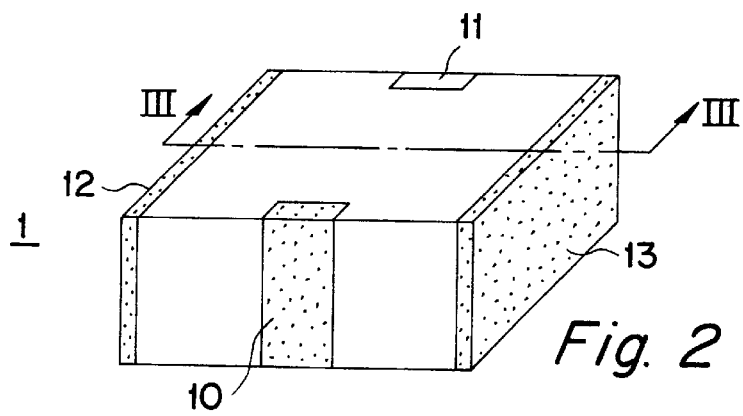
FIG. 2 is an external perspective views showing generally the LC resonating component of FIG. 1.
Figure 3:
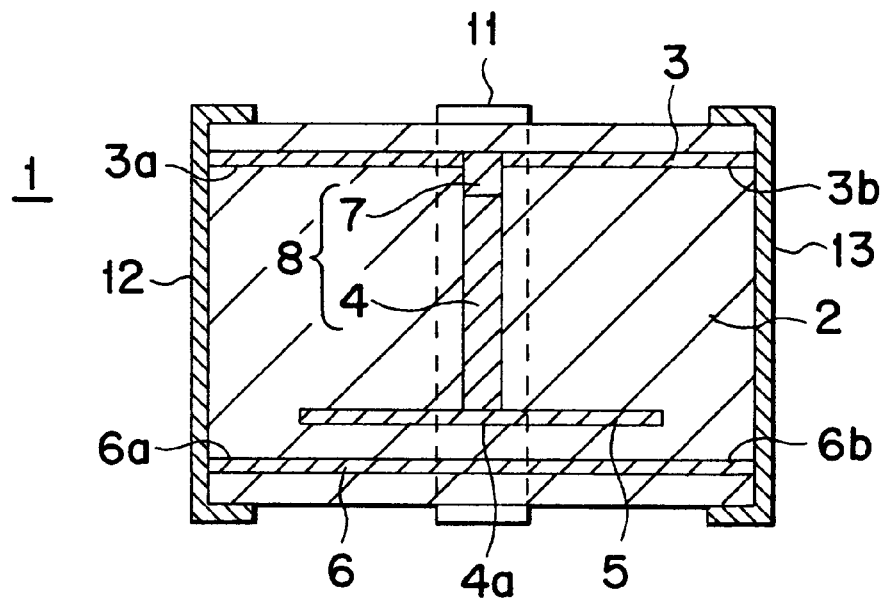
FIG. 3 is a cross-sectional view taken along a line III—III in FIG. 2.

The sheets 2 thus arranged are layered and then sintered into an integrated multilayered structure. Referring to FIGS. 2 and 3, external input/output electrodes 10, 11 are formed respectively on the front and rear ends of the multilayered structure, and external ground electrodes 12, 13 are formed respectively on the left and right ends of the multilayered structure. The external electrodes 10 through 13 are formed by coating, sintering, sputtering, depositing or other technique. The edge portions 5a and 5b of the capacitor electrode 5 are connected to the input/output electrodes 10, 11, respectively, the side edge portion 3a of the ground electrode 3 and the side edge portion 6a of the capacitor electrode 6 are connected to the external ground electrode 12, and the side edge portion 3b of the ground electrode 3 and the side edge portion 6b of the capacitor electrode 6 are connected to the external ground electrode 13.

Figure 4:
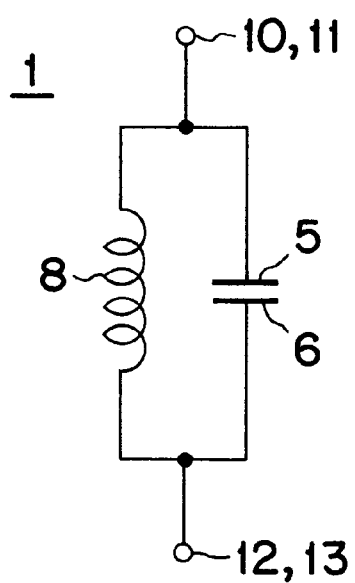
FIG. 4 is an equivalent circuit diagram of the LC resonating component of FIG. 2.

FIG. 4 shows an equivalent LC parallel resonating circuit created by the inductance of the inductor conductive body 8 formed by the via holes 4 and 7 and the capacitance of the capacitor electrodes 5 and 6.

Current flowing through the inductor or conductive body 8 produces a magnetic flux φ that circles around the axis of the inductor conductive body 8 in one or more planes which are perpendicular to the axis of the inductor conductive body. Since the inductor conductive body 8 is perpendicular to the capacitor electrodes 5 and 6, the magnetic flux φ does not penetrate the capacitor electrodes 5, 6, and hence no eddy current is induced in the capacitor electrodes 5, 6. As a result, the eddy current loss is minimized, and a high Q-value LC filter 1 results. Since the inductor conductive body 8 is directly connected to the capacitor electrode 5 without an interconnecting conductor therebetween, the inductance component of such interconnecting conductor is eliminated and the deleterious effects caused thereby. Thus, a filter with good spurious characteristics results.

Figure 5:
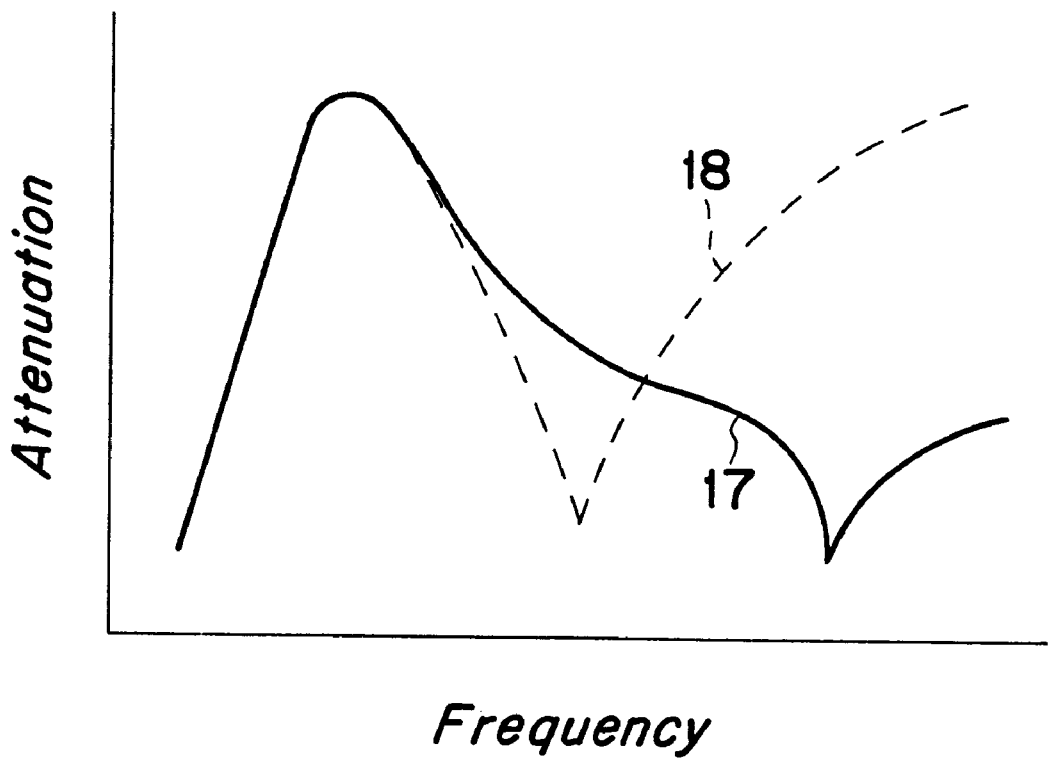
FIG. 5 is a graph showing attenuation characteristics of the LC resonating component of FIG. 2.

Since the inductor conductive body 8 is connected to the capacitor electrode 5 substantially in the center of the electrode 5, the effect of the inductance of the capacitor electrode 5 is minimized. As a result, the spurious characteristics of the filter are even further improved. FIG. 5 illustrates the advantage of connecting the inductor conductive body 8 to the center of the capacitor electrode 5. Solid line 17 shows attenuation as a function of frequency when the inductor conductive body 8 is connected to the center of the capacitor electrode 5, while broken line 18 shows attenuation as a function of frequency when the inductor conductive body 8 is connected to an edge portion of the capacitor electrode 5.

Even when the separation between the inductor conductive body 8 and the capacitor electrode 5 is reduced, the Q-value of the LC filter 1 is not lowered. Thus, the construction of the LC filter 1 permits an LC filter having a low profile (e.g. having a small thickness).

Embodiment 2

FIGS. 6 through 9 illustrate a second embodiment of the present invention. As shown in FIG. 6, a multilayered LC filter 21 comprises an insulating sheet 22 having a ground electrode 23 and via holes 24, 25 and 26, an insulating sheet 22 having via holes 27, 28 and 29, an insulating sheet 22 having a capacitor electrode 30 and via holes 31 and 32, an insulating sheet 22 having a capacitor electrode 33, and a protective insulating sheet 22.

A ground electrode 23 covers its insulating sheet 22 with the exception of the periphery portion of the sheet 22. A via hole 24 having a generally round cross section is formed in the center of the ground electrode 23, and via holes 25 and 26 having slit-shaped cross sections are formed respectively near the left and right ends of the insulating sheet 22. Via holes 27 through 29 are elongated in their axial direction. The via hole 27 has a generally round cross section, and the via holes 28 and 29 have slit-shaped cross sections. The via hole 27 is located in the center of its sheet 22 and the via holes 28 and 29 are located on the left and right sides of via hole 27, respectively. The axial direction of the via holes 27 through 29 are parallel with the direction of the width of the insulating sheet 22. The via hole 27 is connected to the via hole 24, which together comprise an inductor conductive body 34. The bottom end surface 27a of the via hole 27 is directly connected generally to the center of the capacitor electrode 30.

The edge portions 30a and 30b of the capacitor electrode 30 are exposed, respectively, to the front and rear ends of its sheet 22. Via holes 31 and 32 having slit-shaped cross sections are arranged, respectively, on the left and right sides of their sheet 22 with the capacitor electrode 30 centered therebetween. Via holes 25, 28 and 31 are directly connected to form an interconnecting conductor 35, and via holes 26, 29 and 32 are directly connected to form an interconnecting conductor 36. The respective bottom end faces 31a, 32a of via holes 31, 32 are directly connected respectively to the left and right side portions of the capacitor electrode 33. The capacitor electrode 33 paired with the capacitor electrode 30 has its right edge portion 33a exposed.

Figure 8:
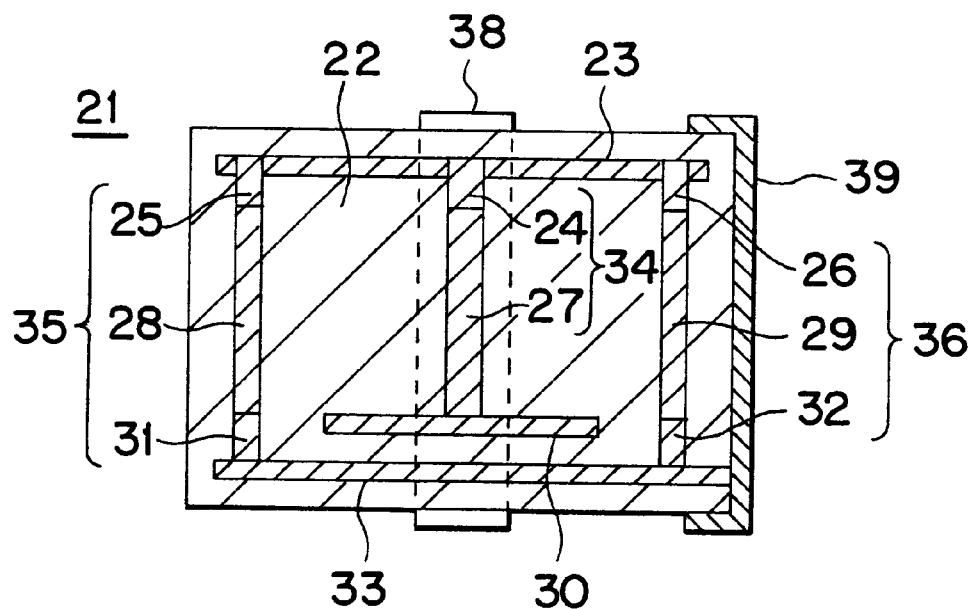
FIG. 8 is a cross-sectional view taken along a line VIII—VIII in FIG. 7.

The sheets 22 thus arranged are layered and then sintered into an integrated multilayered structure. Referring to FIGS. 7 and 8, external input/output electrodes 37, 38 are formed on the front and rear ends of the multilayered structure, respectively, and an external ground electrode 39 is formed on the right end of the multilayered structure. The edge portions 30a and 30b of the capacitor electrode 30 are connected, respectively, to the input/output electrodes 37, 38, and the side edge portion 33a of the ground electrode 33 is connected to the external ground electrode 39.

Figure 9:
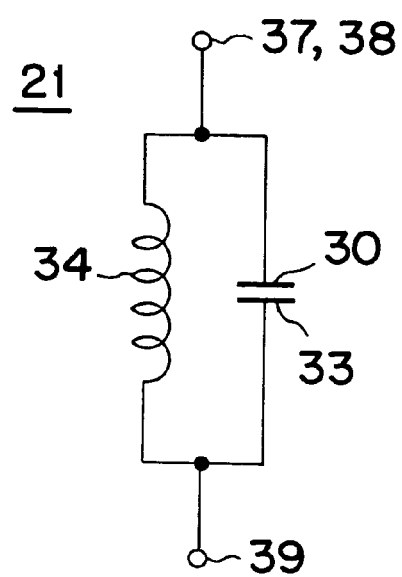
FIG. 9 is an equivalent circuit diagram of the LC resonating component of FIG. 7.
Figure 10:
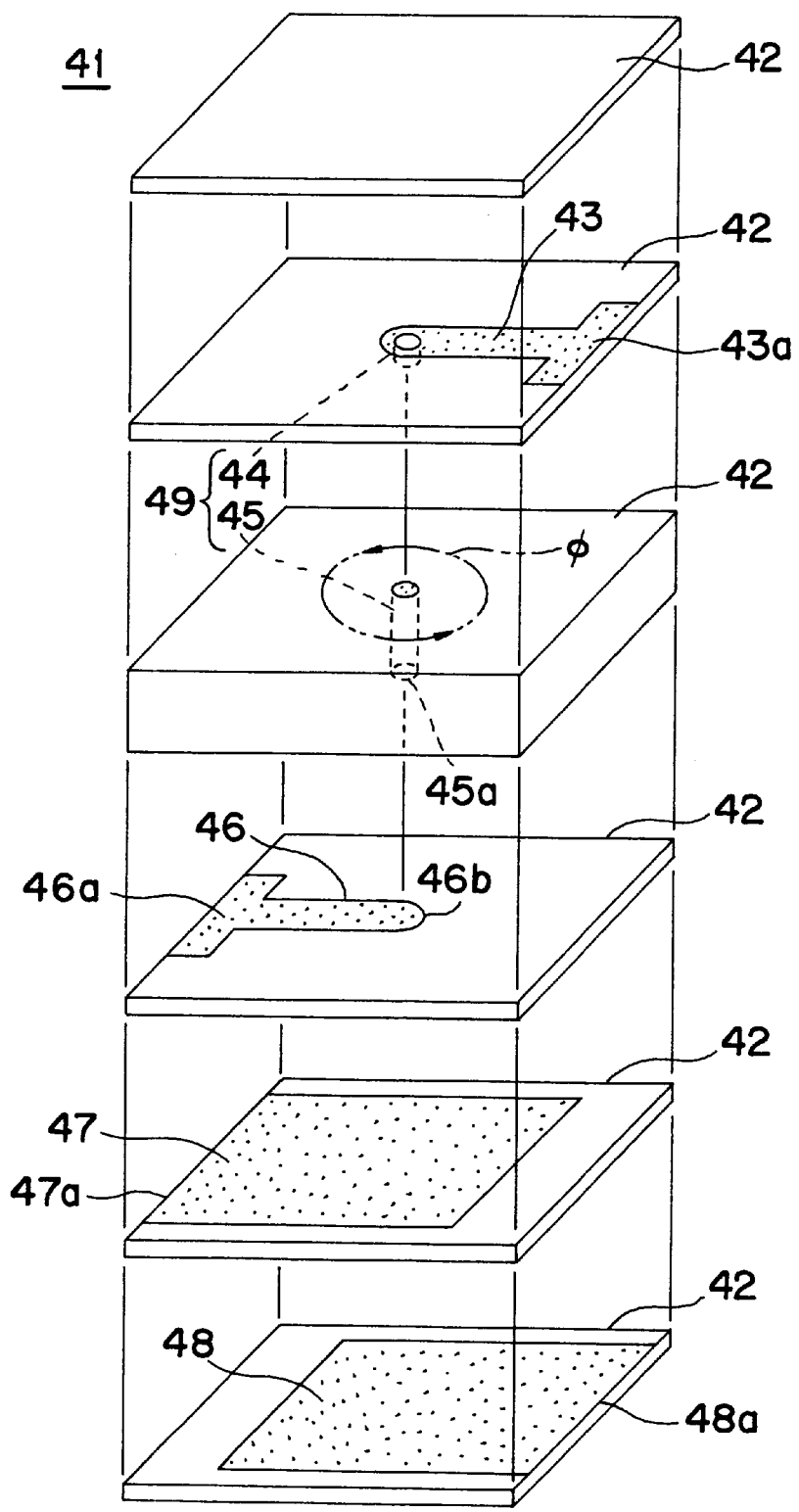
FIG. 10 is an exploded perspective view showing a third exemplary embodiment of the LC resonating component of the present invention.

An equivalent LC parallel resonating circuit is created by the inductance created by the inductor conductive body 34 formed by via holes 24 and 27 and the capacitance created between the capacitor electrodes 30 and 33, as shown in FIG. 9.

Current flowing through the inductor conductive body 34 creates a magnetic flux φ that circles around the axis of the inductor conductive body 34 in one or more planes which are perpendicular to the axis. Since the inductor conductive body 34 is perpendicular to the capacitor electrodes 30 and 33, the magnetic flux φ does not penetrate the capacitor electrodes 30, 33, and no eddy currents are induced in the capacitor electrodes 30, 33.

The LC filter 21 thus constructed offers similar advantages as the filter 1 of the embodiment 1.

Embodiment 3

Figure 11:
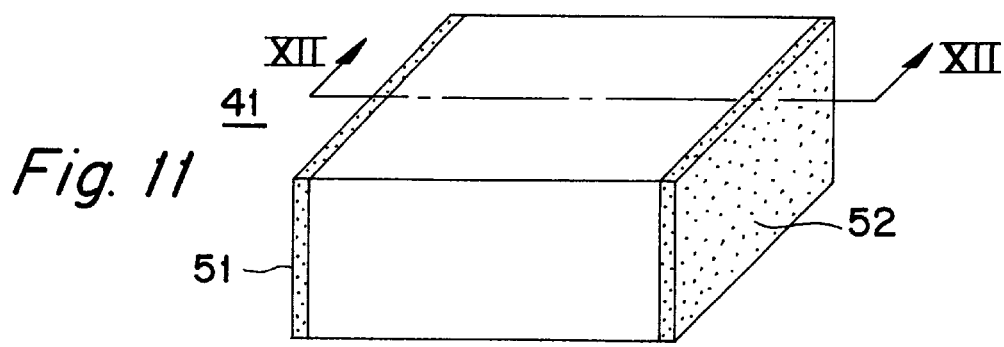
FIG. 11 is an external perspective view showing generally the LC resonating component of FIG. 10.
Figure 12:
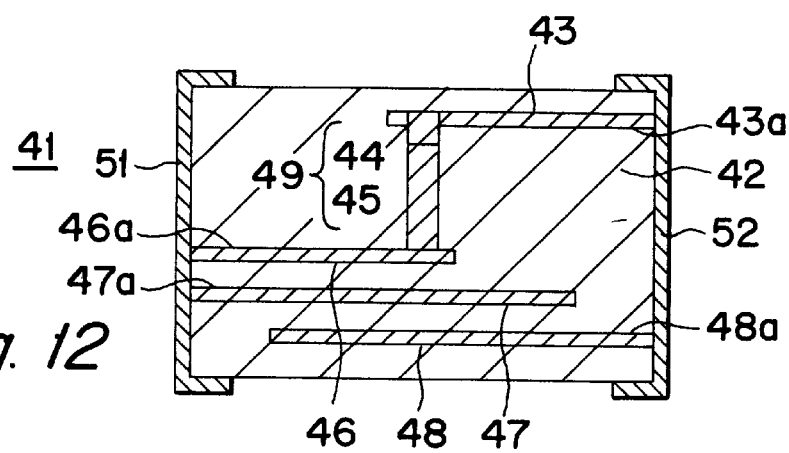
FIG. 12 is a cross-sectional view taken along a line XII—XII in FIG. 11.
Figure 13:
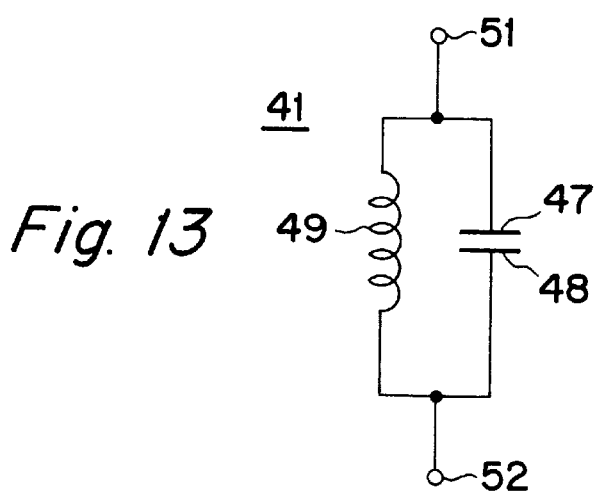
FIG. 13 is an equivalent circuit diagram of the LC resonating component of FIG. 11.

FIGS. 10 through 13 show a third embodiment of the present invention. As shown in FIG. 13, a multilayered LC filter 41 comprises an insulating sheet 42 having an extension electrode 43 on its surface and approximately in its center a via hole 44 connected to the end of the extension electrode 43, an insulating sheet 42 having a via hole 45 approximately in its center, an insulating sheet 42 having an extension electrode 46 on its surface, insulating sheets 42, 42 having capacitor electrodes 47, 48, respectively, and a protective insulating sheet 42.

One side edge portion 43a of the extension electrode 43 is exposed to the right end of its sheet 42. The via hole 44 is connected to the via hole 45, and via holes 44, 45 together comprise an inductor conductive body 49. The bottom end face 45a of the via hole 45 is directly connected to the end portion 46b of the extension electrode 46. The via hole 45 is elongated in its axial direction, and is formed in the sheet 42 so that the axial direction of the via hole 45 is parallel to the direction of the thickness of the sheet 42. The side edge portion 46a of the extension electrode 46 is exposed to the left end of the sheet 42. The capacitor electrodes 47, 48 have respectively side edge portions 47a, 48a exposed, respectively, to the left of one sheet 42 and the right end of another sheet 42.

The sheets 42 thus arranged are layered and then sintered into an integrated multilayered structure. Referring to FIGS. 11 and 12, external electrodes 51, 52 are formed on the left and right ends of the multilayered structure, respectively. The side edge portion 46a of the extension electrode 46 and the side edge portion 47a of the capacitor electrode 47 are connected to the external electrode 51, and the side edge portion 43a of the extension electrode 43 and the side edge portion 48a of the capacitor electrode 48 are connected to the external electrode 52.

FIG. 13 shows an equivalent circuit created by the inductance of the inductor conductive body 49 formed by the via holes 44, 45 and the capacitance between the capacitor electrodes 47 and 48 via the extension electrode 46 and the external electrode 51. The filter 41 in embodiment 3 is different from embodiments 1 and 2 in that the filter 41 includes an inductor conductive body which is not directly connected to the capacitor electrode, whereas the filters 1 and 21 include inductor conductive bodies directly connected to their respective capacitor electrodes.

Current flowing through the inductor conductive body 49 generates a magnetic flux φ that circles around the axis of the inductor conductive body 49 in one or more planes perpendicular to the axis. Since the inductor conductive body 49 is perpendicular to the capacitor electrodes 47, 48, the magnetic flux φ does not penetrate the capacitor electrodes 47, 48, and hence no eddy currents are induced in the capacitor electrodes 47, 48. As a result, the eddy current loss is minimized, and a high Q-value LC filter 41 is obtained.

The filter thus constructed is advantageous when insulating sheets 42 having different permitivities ε are combined. For example, in FIG. 10, the top four insulating sheets 42 can comprise ferrite sheets, and the remaining two insulating sheets 42 can comprise dielectric sheets. In this arrangement, the magnetic path of magnetic flux φ is separated from the capacitor electrode 47 with some clearance left therebetween, and thus the eddy current loss is further reduced.

Embodiment 4

Figure 14:
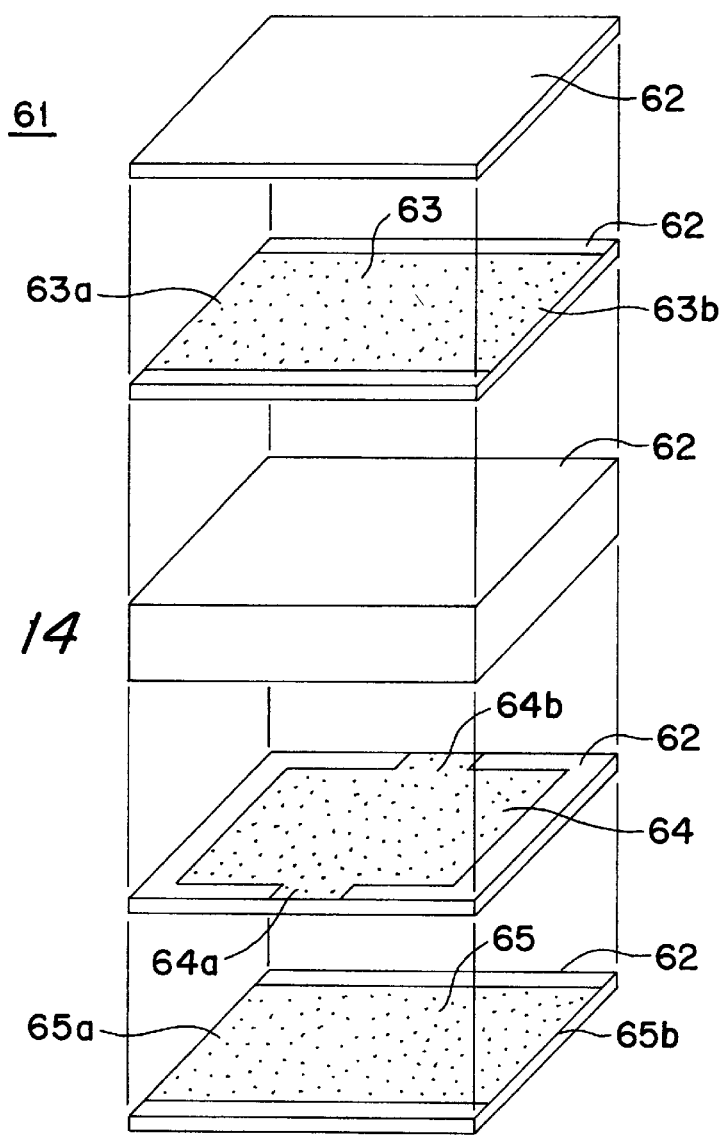
FIG. 14 is an exploded perspective view showing a fourth exemplary embodiment of the LC resonating component of the present invention.
Figure 15:
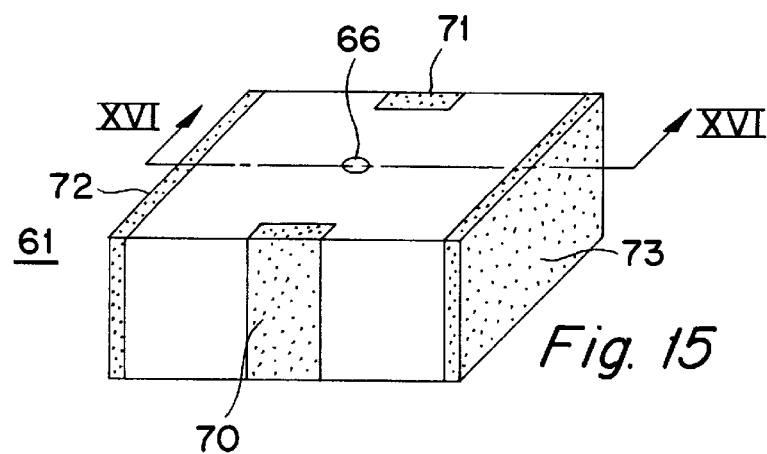
FIG. 15 is an external perspective view showing generally the LC resonating component of FIG. 14.
Figure 16:
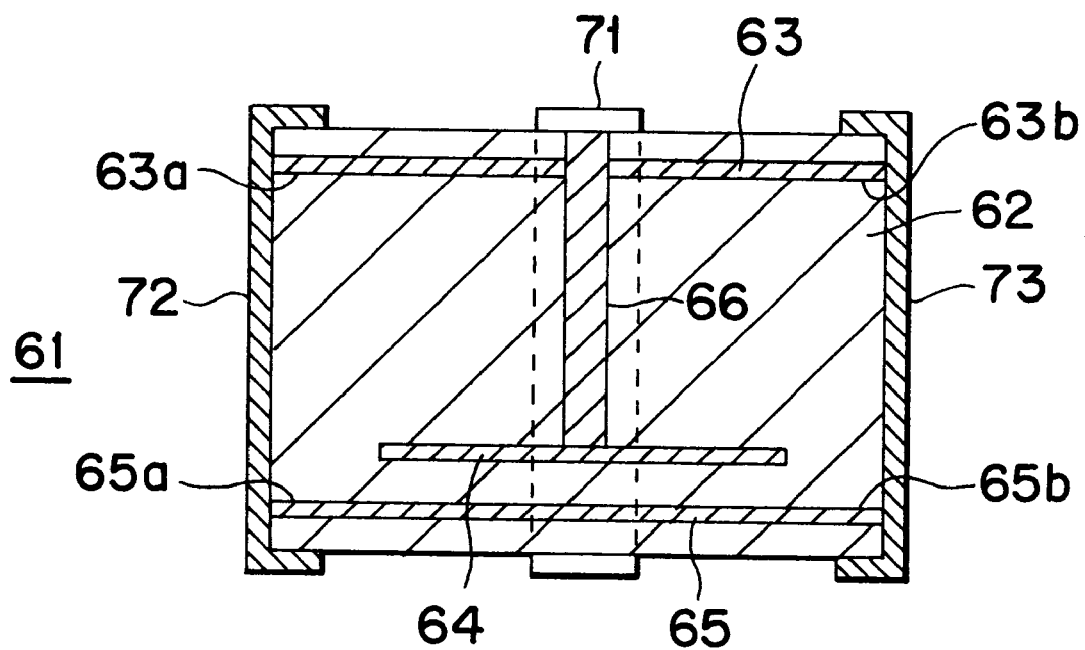
FIG. 16 is a cross-sectional view taken along a line XVI—XVI in FIG. 15.

FIGS. 14 through 16 illustrate a fourth embodiment of the present invention. As shown in FIG. 14, a multilayered LC filter 61 comprises an insulating sheet 62 having a ground electrode 63 on it surface, insulating sheets 62, 62 having capacitor electrodes 64, 65 on their respective surfaces, an intermediate insulating sheet 62, and a top-most protective insulating sheet 62.

The ground electrode 63 has side edge portions 63a, 63b exposed, respectively, to the left and right ends of its insulating sheet 62. The capacitor electrode 64 has side edge portions 64a, 64b respectively exposed to the front and rear ends of its insulating sheet 62. The capacitor electrode 65 paired with the capacitor electrode 64 has side edge portions 65a, 65b respectively exposed to the left and right ends of its insulating sheet 62.

The sheets 62 thus arranged are layered and then sintered into an integrated multilayered structure. The intermediate insulating sheet 62 having nothing on its surface is interposed between the insulating sheet 62 having the ground electrode 63 on its surface and the insulating sheet 62 having the capacitor electrode 64 on its surface.

After forming the integrated multilayered structure, a hole is formed which extends to the capacitor electrode 64 (with reference to FIGS. 15 and 16). The hole is vertically drilled in the multilayered structure from its top center using, for example, a drill bit, a laser beam, an electron beam or a combination of these techniques. Thereafter, the hole is filled with a conductive material to form an inductor conductive body 66.

Next, external input/output electrodes 70, 71 are formed, respectively, on the front and rear ends of the multilayered structure, and external ground electrodes 72, 73 are formed, respectively, on the left and right ends of the multilayered structure. The side edge portions 64a, 64b of the capacitor electrode 64 are respectively connected to the external input/output electrodes 70, 71, the side edge portion 63a of the ground electrode 63 and the side edge portion 65a of the capacitor electrode 65 are connected to the external ground electrode 72, and the side edge portion 63b of the ground electrode 63 and the side edge portion 65b of the capacitor electrode 65 are connected to the external ground electrode 73.

The equivalent circuit of FIG. 4 represents the circuit created by the inductance of the inductor conductive body 66 combined with the capacitance between the capacitor electrodes 64 and 65. The LC filter 61 offers similar advantages as the LC filter 1.

Embodiment 5

Figure 17:
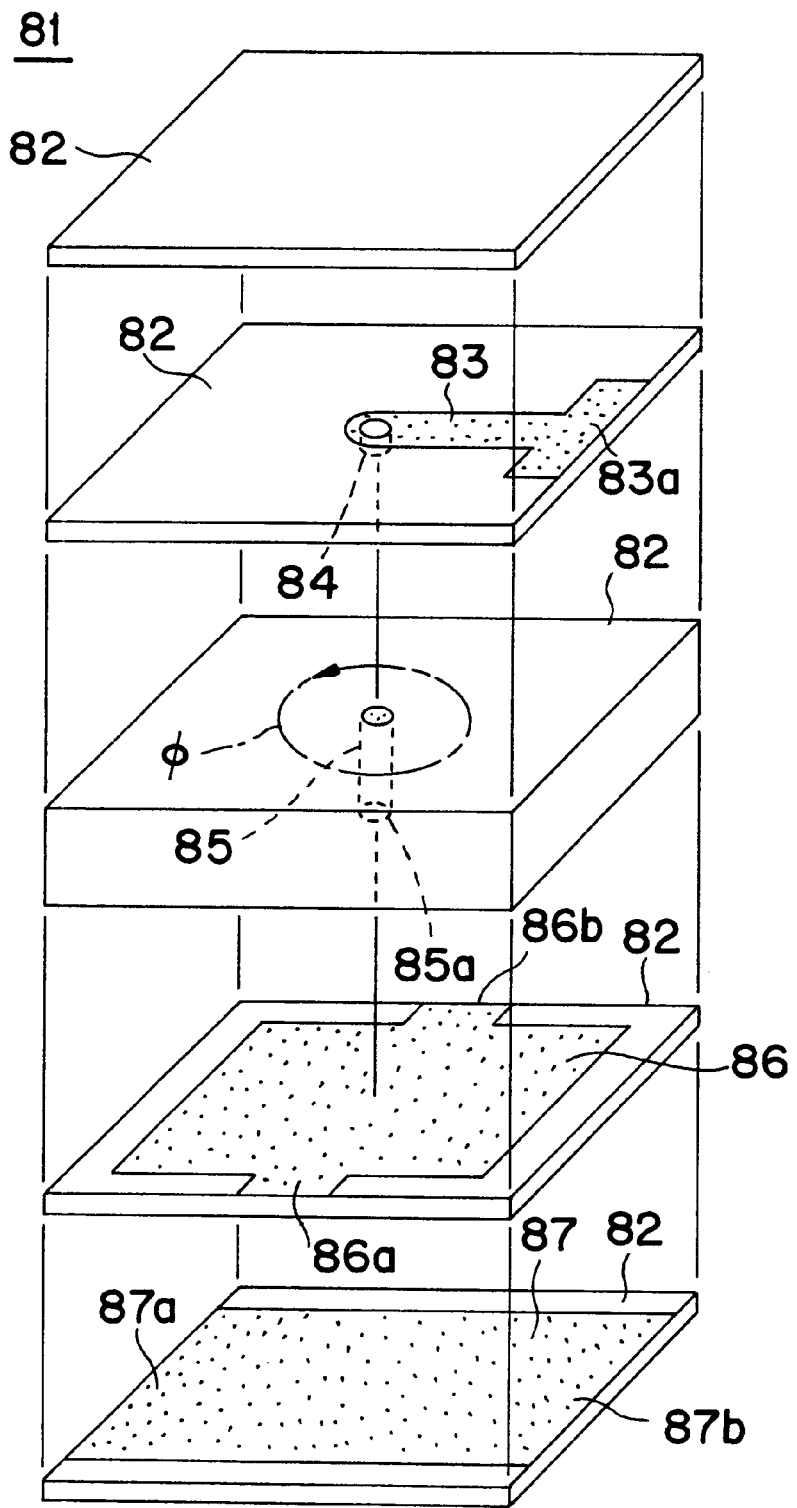
FIG. 17 is an exploded perspective view showing a fifth exemplary embodiment of the LC resonating component of the present invention.
Figure 18:
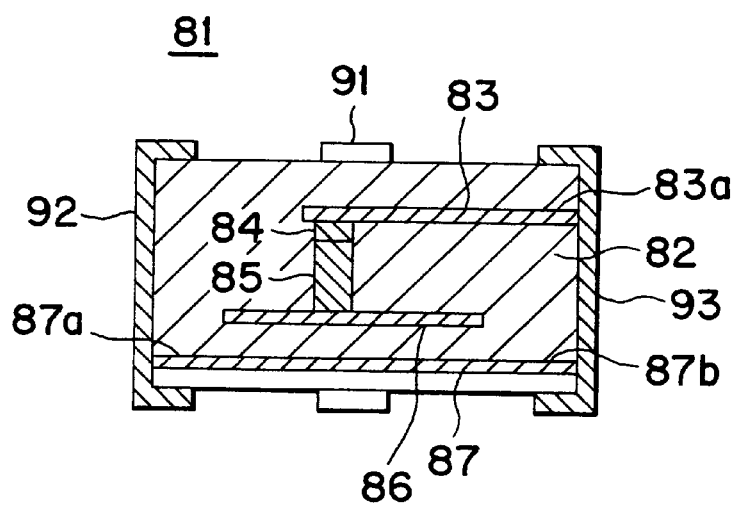
FIG. 18 is a cross-sectional view showing the LC resonating component of FIG. 17.
Figure 19:
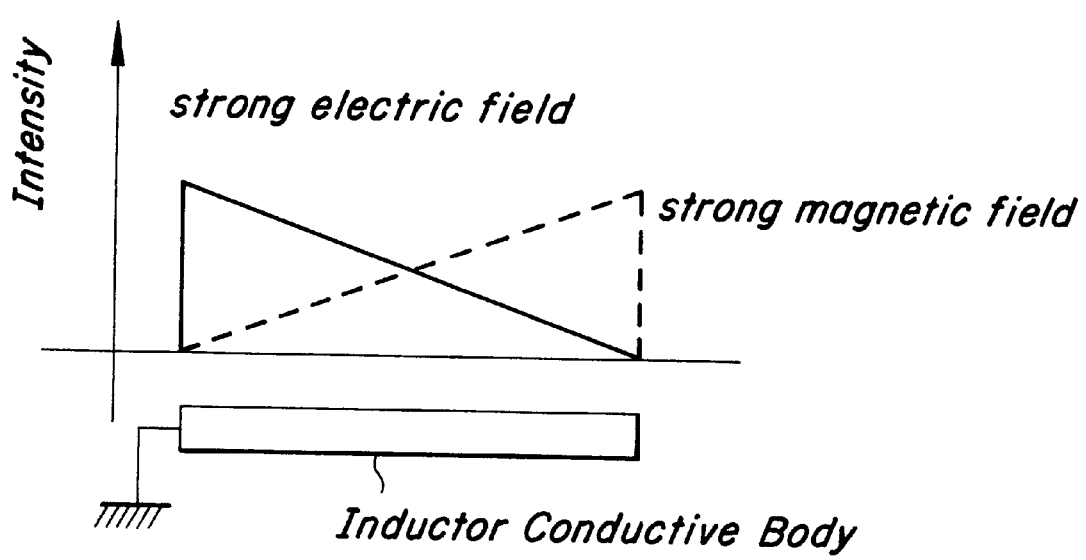
FIG. 19 is a graph showing intensities of an electric field and a magnetic field in the LC resonating component of FIG. 17.

FIGS. 17 through 19 show a fifth embodiment of the present invention. As shown in FIG. 17, a multilayered LC filter 81 comprises an insulating sheet 82 having a patterned conductor 83 on its surface and in its center a via hole 84 connected to the end of the patterned conductor 83, an insulating sheet 82 having a via hole 85 in its center, insulating sheets 82, 82 having capacitor electrodes 86, 87 on their respective surfaces, and a protective insulating sheet 82.

The side edge portion 83a of the patterned conductor 83 is exposed to the right end of its insulating sheet 82. The via hole 84 is connected to the via hole 85, and the via holes 84, 85 and the patterned conductor 83 together comprise an inductor conductive body. The bottom end face 85a of the via hole 85 is directly connected to the capacitor electrode 86 approximately at its center. The via hole 85 is elongated in its axial direction, and is formed in the insulating sheet 82 such that the axial direction of the via hole 85 is parallel with the direction of the thickness of the sheet 82. The capacitor electrode 86 has side edge portions 86a, 86b exposed, respectively, to the front and rear ends of its insulating sheet 82. The capacitor electrode 87 paired with the capacitor electrode 86 has side edge portions 87a, 87b exposed, respectively, to the left and right ends of its insulating sheet 82.

The sheets 82 thus arranged are layered and then sintered into an integrated multilayered structure. Referring to FIG. 18, external input/output electrodes 91 are formed, respectively, on the front and rear ends of the multilayered structure (the front electrode 91 is not shown in FIG. 18), and external ground electrodes 92, 93 are formed, respectively, on the left and right ends of the multilayered structure. The side edge portion 86a of the capacitor electrode 86 is connected to the unshown front external electrode 91, the side edge portion 86b is connected to the rear external electrode 91, the side edge portion 87a of the capacitor electrode 87 is connected to the ground electrode 92, and the side edge portion 83a of the patterned conductor 83 and the side edge portion 87b of the capacitor electrode 87 are connected to the external ground electrode 93.

FIG. 4 again illustrates the equivalent LC parallel resonating circuit created by the inductance of the inductor conductive body formed by the patterned conductor 83 and the via holes 84, 85, combined with the capacitance created between the capacitor electrodes 86, 87.

Current flowing through the inductor conductive body generates a magnetic flux φ that circles around the axis of the inductor conductive body in one or more planes perpendicular to the axis. Since the inductor conductive body is perpendicular to the capacitor electrodes 86 and 87, the magnetic flux φ does not penetrate the capacitor electrodes 86 and 87 and no eddy currents are induced in the capacitor electrodes 86 and 87. As a result, the eddy current loss is minimized, and a high Q-value LC filter 81 results.

The inductor conductive body in the LC filter 81 has an electric field and a magnetic field as shown in FIG. 19. The inductor conductive body is connected, at one end, to the external ground electrode 93, and at the other end to the capacitor electrode 86. In this case, the magnetic field becomes strongest at the joint between the bottom end face 85a of the via hole 85 and the capacitor electrode 86. Although with a strong magnetic field radiation is likely to take place, the radiation is controlled because the other capacitor electrode 87 (which is grounded) is opposite the capacitor 86. Although a weak magnetic field is generated at the patterned conductor 83, no radiation takes place because the patterned conductor 83 is connected to the external ground electrode 93. For this reason, a shield electrode for generally preventing radiation is unnecessary, and the electronic component can be manufactured with further reduced dimensions.

Regarding the electric field, the region where a relatively stronger electric field is created is the region of the inductor conductive body closest to the external ground electrode 93 (e.g. where the inductor conductive body joins the patterned conductor 83). Thus, even if an external metal object is placed near the component, undesirable capacitance is less likely to occur. The resonance characteristics of the component are thus reliable. The component of embodiment 5 makes an ideal resonator.

Embodiment 6

Figure 20:
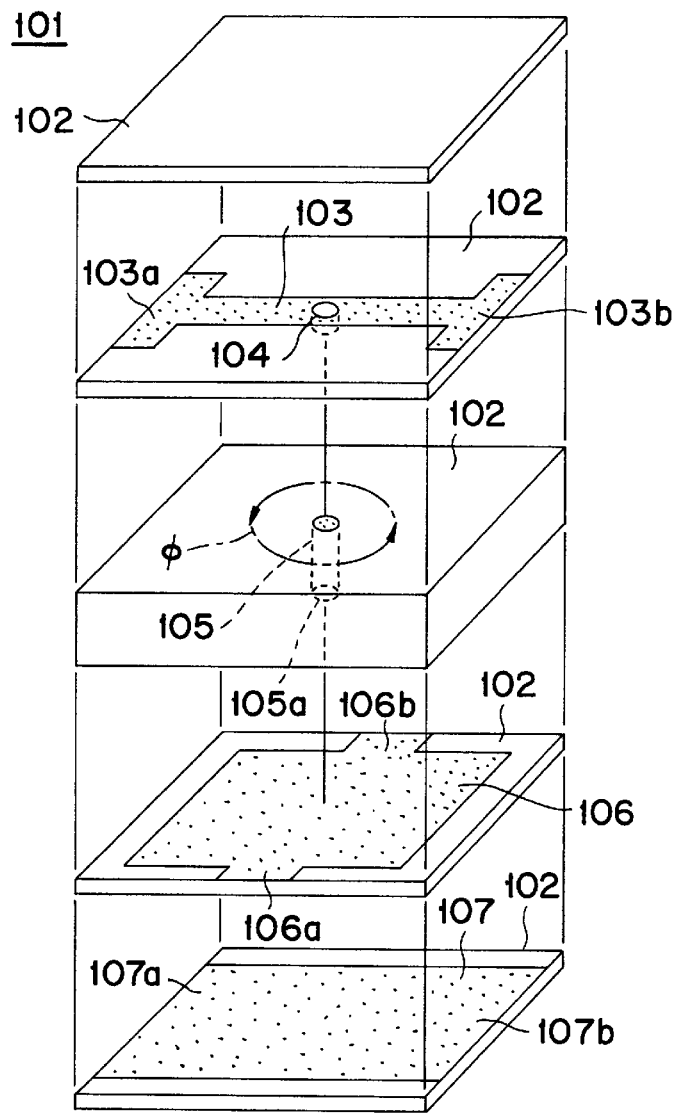
FIG. 20 is an exploded perspective view showing a sixth exemplary embodiment of the LC resonating component of the present invention.
Figure 21:
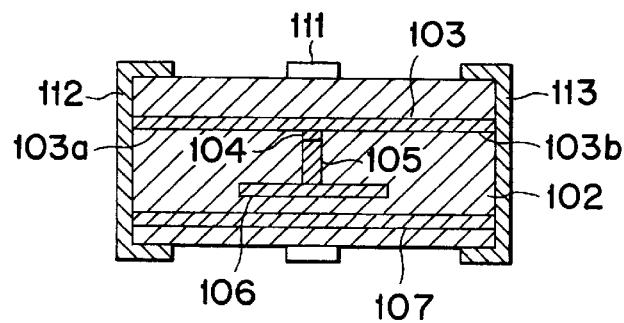
FIG. 21 is a cross-sectional view showing the LC resonating component of FIG. 20.

FIGS. 20 and 21 show a sixth embodiment of the present invention. As shown in FIG. 20, a multilayered LC filter 101 comprises an insulating sheet 102 having a patterned conductor 103 on its surface and a via hole 104 connected to the patterned conductor 103 approximately at its center, an insulating sheet 102 having a via hole 105 approximately in its center, insulating sheets 102, 102 having capacitor electrodes 106, 107 on their respective surfaces, and a protective insulating sheet 102.

The side edge portions 103a, 103b of the patterned conductor 103 are exposed, respectively, to the left and right ends of their insulating sheet 102. The via hole 104 is connected to the via hole 105, and the via holes 104 and 105 and the patterned conductor 103 together comprise an inductor conductive body. The bottom end face 105a of the via hole 105 is directly connected to the capacitor electrode 106 approximately at its center. The via hole 105 is elongated in its axial direction, and is formed in the insulating sheet 102 such that the axial direction of the via hole 105 is parallel to the direction of the thickness of the sheet 102. The capacitor electrode 106 has side edge portions 106a, 106b exposed, respectively, to the front and rear ends of its insulating sheet 102. The capacitor electrode 107 paired with the capacitor electrode 106 has side edge portions 107a, 107b exposed, respectively, to the left and right ends of its insulating sheet 102.

The sheets 102 thus arranged are layered and then sintered into an integrated multilayered structure. Referring to FIG. 21, external input/output electrodes 111 are formed, respectively, on the front and rear ends of the multilayered structure (the front external electrode 111 is not shown in FIG. 21), and external ground electrodes 112, 113 are formed, respectively, on the left and right ends of the multilayered structure. The side edge portion 106a of the capacitor 106 is connected to the unshown front external electrode 111, the side edge portion 106b is connected to the rear external electrode 111, the side edge portion 103a of the patterned conductor 103 and the side edge portion 107a of the capacitor electrode 107 are connected to the external ground electrode 112, and the side edge portion 103b of the patterned conductor 103 and the side edge portion 107b of the capacitor electrode 107 are connected to the external ground electrode 113.

FIG. 4 represents the equivalent circuit created by the inductor conductive body formed by the patterned conductor 103 and the via holes 104, 105, combined with the capacitance between the capacitor electrodes 106, 107.

Current flowing through the inductor conductive body generates a magnetic flux φ that circles around the axis of the inductor conductive body in one or more planes perpendicular to the axis. Since the inductor conductive body is perpendicular to the capacitor electrodes 106, 107, the magnetic flux φ does not penetrate the capacitor electrodes 106, 107 and no eddy currents are induced in the capacitor electrodes 106, 107. As a result, the eddy current loss is minimized, and a high Q-value LC filter 101 is obtained. The intensities of electric and magnetic fields described in connection with embodiment 5 also apply to the embodiment 6. Furthermore, no radiation occurs and the resonance characteristics of the component are reliable.

Embodiment 7

Figure 22:
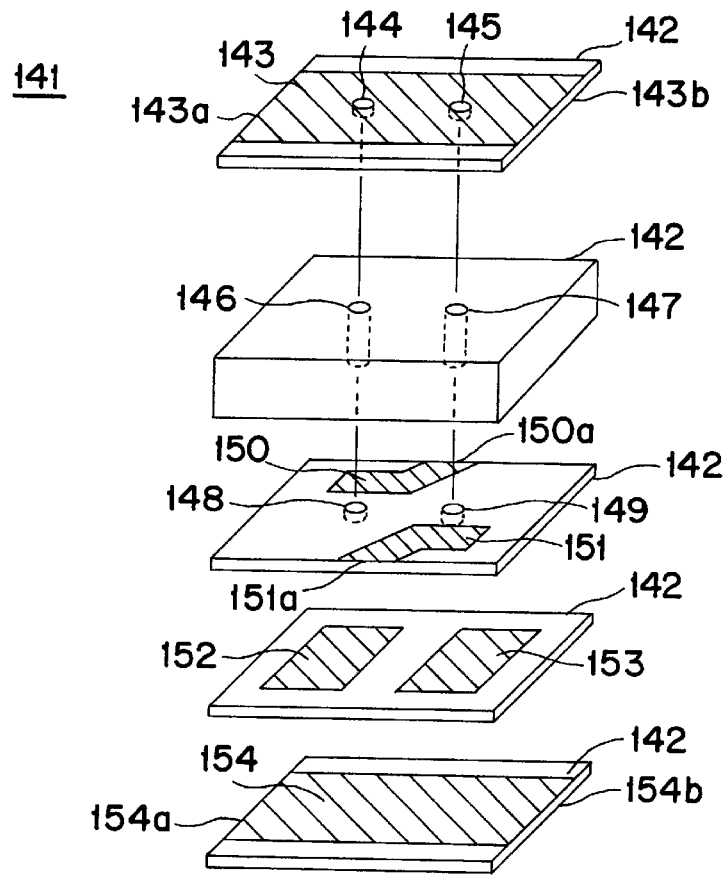
FIG. 22 is an exploded perspective view showing a seventh exemplary embodiment of the LC resonating component of the present invention having plural inductor conductive bodies.
Figure 23:
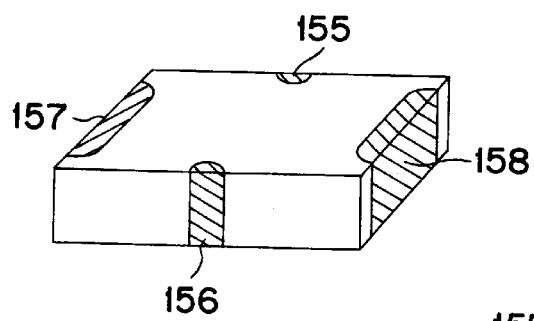
FIG. 23 is an external perspective view showing generally the LC resonating component of FIG. 22.
Figure 24:
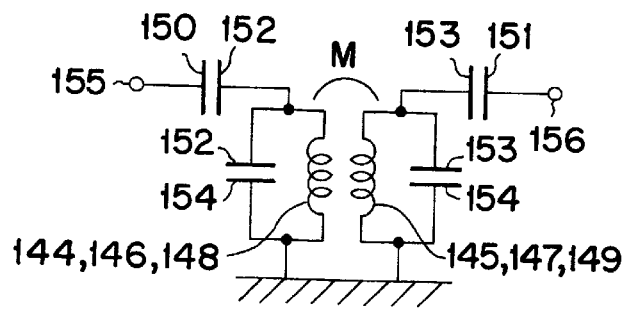
FIG. 24 is an equivalent circuit diagram of the LC resonating component of FIG. 22.
Figure 25:
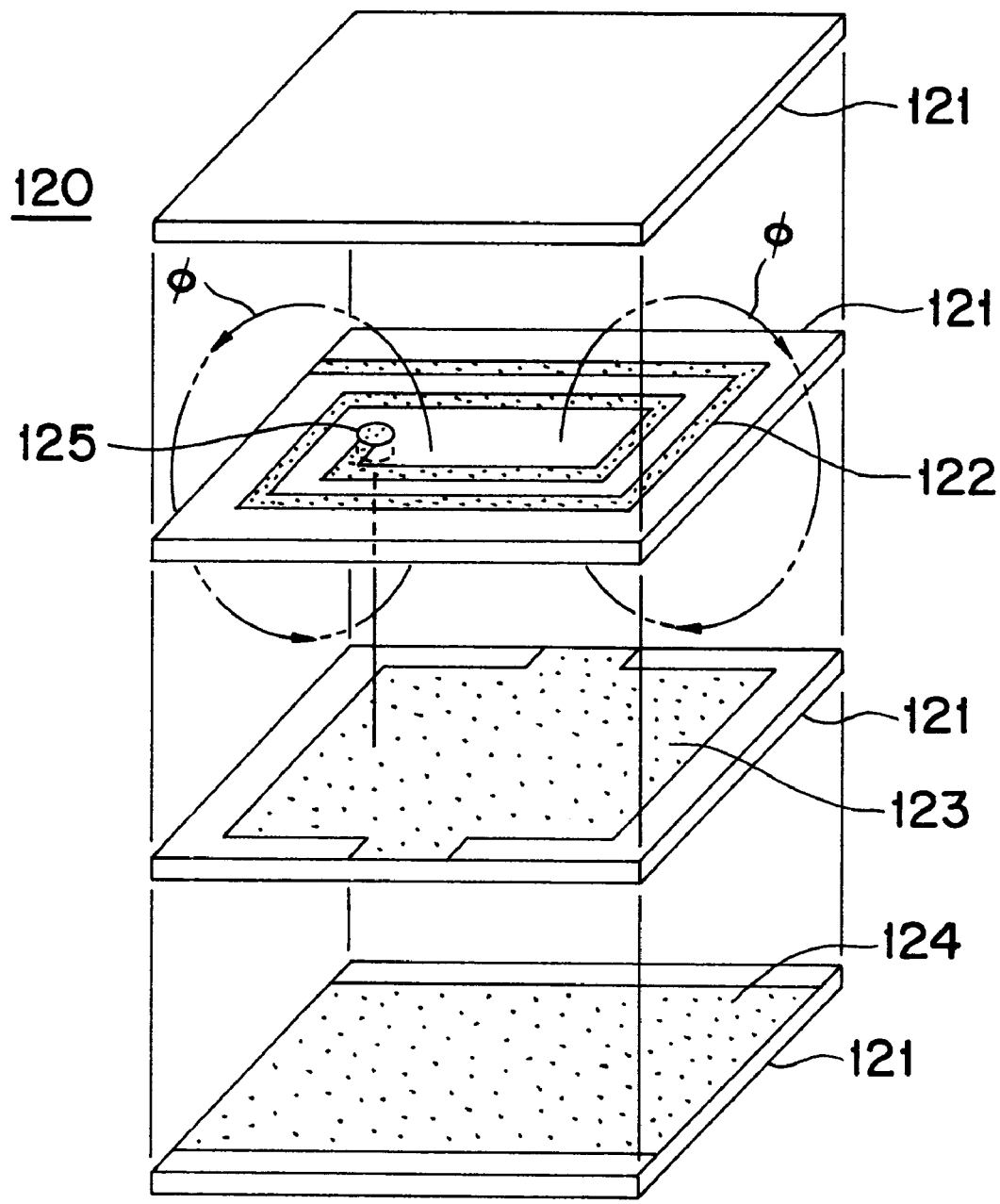
FIG. 25 is the exploded perspective view showing a conventional LC resonating component.

FIGS. 22 through 24 illustrate a seventh embodiment of the present invention. As shown in FIG. 22, a multilayered LC bandpass filter 141 comprises an insulating sheet 142 having a ground electrode 143 on its top surface and via holes 144 and 145 connected to the ground electrode 143. The via holes 144 and 145 connect to via holes 146 and 147 formed in an adjacent sheet 142. The via holes 146 and 147, in turn, connect to via holes 148 and 149 in an adjacent sheet 142. The sheet including via holes 148 and 149 also includes input/output capacitor conductors 150 and 151 formed on its top surface in proximity to the via holes 148 and 149. The via holes 148 and 149 are connected to respective capacitor electrodes 152 and 153 formed on an adjacent sheet 142. Finally, a bottom-most sheet 142 includes a ground capacitor electrode 154 formed on its top surface.

The ground electrode 143 has side edge portions 143a and 143b exposed on the left and right ends of the sheet 142. The via hole 144 is connected to the via hole 146, which in turn in connected to the via hole 148, and together these elements comprise a first inductor conductive body. The via hole 145 is connected to the via hole 147, which in turn in connected to the via hole 149, and together these elements comprise a second inductor conductive body. The bottom end faces of the via holes 148 and 149 are directly connected to the respective capacitor electrodes 152 and 153. The via holes 146 and 147 are elongated in their axial direction, and are formed such that their axial direction is parallel with the direction of the thickness of the sheets 142. The via holes 144, 145, 146, 147, 148 and 149 can be formed by any of the methods discussed above.

The capacitor electrodes 152 and 153 do not extend to the edges of their sheet 142. However, the capacitor electrode 154 has side edge portions 154a and 154b exposed respectively to the left and right ends of its sheet 142.

The sheets 142 thus arranged are layered and then sintered into an integrated multilayered structure. Referring to FIG. 23, external input/output electrodes 155, 156 are formed respectively on the rear and front ends of the multilayered structure, and external ground electrodes 157, 158 are formed respectively on the left and right ends of the multilayered structure. Respective edge portions 150a, 151a of the input/output conductors 150 and 151 are connected to respective input/output electrodes 155, 156. Side edge portion 143a of the ground electrode 143 and side edge portion 154a of the capacitor electrode 154 are connected to the external ground electrode 157, and the side edge portion 143b of the ground electrode 143 and the side edge portion 154b of the capacitor electrode 154 are connected to the external ground electrode 158.

FIG. 24 shows an equivalent LC resonating circuit created by the inductance of the inductor conductive bodies formed by the via holes, and the capacitance of the capacitor electrodes.

Current flowing through the inductor conductive bodies produces a magnetic flux $\phi$ that circles around the axes of the inductor conductive bodies in one or more planes which are perpendicular to the axes of the inductor conductive bodies. Since the inductor conductive bodies are perpendicular to the capacitor electrodes, the magnetic flux $\phi$ does not penetrate the capacitor electrodes, and hence no eddy current is induced in the capacitor electrodes. As a result, the eddy current loss is minimized, as described above with respect to the previously described embodiments.

Although only two inductor conductive bodies are shown, more than two bodies can be included.

Other Embodiments

The LC resonating components of the present invention are not limited to the above embodiments. More specifically, the above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims.

For example, although each of the above embodiments has been discussed in connection with a resonating component having an LC parallel resonator circuit, a resonating component having an LC series resonator circuit can be constructed based on the principles disclosed herein.

In the resonating component of embodiment 3, the inductor conductive body is connected to the capacitor electrode through the external electrode. Alternatively, as described in embodiment 2, the inductor conductive body can be connected to the capacitor electrode through an interconnecting conductor formed of connected via holes instead of the external electrode.

In each of the above embodiments, sheets are layered and then sintered into an integral structure, but the present invention is not limited to this method. Sheets that have already been sintered can be used. Alternatively, the LC resonating component can be manufactured according to the following method. Insulating material paste is coated through a printing technique, and then is dried to form an insulating layer. Then, conductive material paste is coated on the surface of the insulating layer, and is then dried to form the required electrodes and/or inductor conductive body. By repeatedly performing a series of coatings in this manner, a multilayered structure comprising a resonating component is obtained.

According to the present invention, as described above, since the inductor conductive body is perpendicular to the capacitor electrodes, the magnetic flux that is created when a current flows through the inductor conductive body causes no eddy currents in the capacitor electrodes. As a result, the eddy current loss is reduced, and a high Q-value LC resonating component results.

By employing a via hole as the inductor conductive body, it is easy to manufacture an LC resonating component that has an inductor conductive body perpendicular to a capacitor electrode.

Even when the separation between the inductor conductive body and the capacitor electrode is reduced, the Q-value of the component is not degraded. Thus, an LC resonating component having a low profile can be obtained.

What is claimed is:

1. An LC resonating component comprising:
   an inductor conductive body formed by a first via hole which passes through an insulating layer, wherein the via hole is filled with a conductive material; and
   a pair of capacitor electrodes comprising a first and a second capacitor electrodes;

wherein the inductor conductive body extends in a direction which is generally perpendicular to the pair of capacitor electrodes;

and wherein said inductor conductive body includes a first end which is connected to ground, and a second end connected to said first capacitor electrode.

2. The LC resonating component of claim 1, wherein said first and second capacitor electrodes have planar surfaces, and said inductor conductive body comprises a linear via hole which connects said planar surfaces.

3. The LC resonating component of claim 1, further comprising:

a ground electrode; and wherein said first end of said via hole is directly connected to said ground electrode.

4. The LC resonating component of claim 3, further comprising:

a second via hole having a first end connected to said ground electrode and a second end connected to said second capacitor electrode; and a third via hole having a first end connected to said ground electrode and a second end connected to said second capacitor electrode.

5. The LC resonating component of claim 3, wherein said first end of said inductor conductive body is directly connected to a central portion of said ground electrode, and said second end of said inductor conductive body is directly connected to a central portion of said first capacitor electrode.

6. The LC resonating component of claim 1, further comprising:

a conductor member; and wherein said first end of said via hole is directly connected to said conductor member.

7. The LC resonating component of claim 6, further comprising:

a first external ground electrode and a second external ground electrode;

wherein said conductor member is connected to said first external ground electrode.

8. The LC resonating component of claim 7, wherein said conductor member is also connected to said second external ground electrode.

9. The LC resonating component of claim 1, further comprising:

a first extension electrode and a second extension electrode; and wherein said first end of said via hole is directly connected to said first extension electrode and said second end is directly connected to said second extension electrode.

10. The LC resonating component of claim 1, wherein said second end of said inductor conductive body is connected to a central portion of said first capacitor electrode.

11. A method for manufacturing an LC resonating component, comprising the steps of:

forming a first insulating sheet having a ground electrode formed thereon, and a first conductive via hole passing through said first sheet;

forming a second insulating sheet having a second conductive via hole passing therethrough;

forming a third insulating sheet having a capacitor electrode formed thereon;

aligning said first sheet and said second sheet so that said first via hole is generally axially coincident with said second via hole; and laminating at least said first, second and third sheets together, such that said first and second via holes form an inductor conductive body which connects said ground electrode to said capacitor electrode.

12. A method for manufacturing an LC resonating component, comprising the steps of:

forming a first insulating sheet having a ground electrode formed thereon;

forming a second insulating sheet;

forming a third insulating sheet having a capacitor electrode formed thereon;

laminating at least said first, second and third sheets together to produce a laminated structure; and forming a conductive via hole in said laminated structure which connects said ground electrode to said capacitor electrode.

13. A LC resonating component comprising:

a plurality of inductor conductive bodies; and a plurality of capacitor electrodes respectively connected to individual inductor conductive bodies;

wherein each inductor conductive body extends in a direction which is generally perpendicular to a respective capacitor electrode;

wherein said plurality of inductor conductive bodies have first ends which are connected to ground, and second ends which are connected to said respective capacitor electrodes.

14. The LC resonating component of claim 13, wherein the inductor conductive bodies each comprise a via hole filled with a conductive material.

15. The LC resonating component of claim 13, further comprising:

a ground electrode; and an insulating layer separating said ground electrode from said capacitor electrodes.

16. The LC resonating component of claim 13, further including first and second input/output capacitor conductors disposed in proximity to said inductor conductive bodies.

17. A method of making a LC resonating component, comprising the steps of:

forming a plurality of inductor conductive bodies; and forming a plurality of capacitor electrodes respectively connected to individual inductor conductive bodies;

wherein the inductor conductive bodies extend in a direction which is generally perpendicular to respective capacitor electrodes;

wherein said plurality of inductor conductive bodies have first ends which are connected to ground, and second ends which are connected to said respective capacitor electrodes.

18. The method of making a LC resonating component of claim 17, further comprising:

forming a ground electrode; and forming an insulating layer separating said ground electrode from said capacitor electrodes.

19. The method of making a LC resonating component of claim 17, further including the step of forming first and second input/output capacitor conductors disposed in proximity to said inductor conductive bodies.

* * * * *